US010027352B2

(12) United States Patent
Mastantuono et al.

(10) Patent No.: US 10,027,352 B2
(45) Date of Patent: Jul. 17, 2018

(54) RECEIVING A PLURALITY OF RADIO FREQUENCY BANDS

(71) Applicant: Telefonaktiebolaget LM Ericsson (Publ), Stockholm (SE)

(72) Inventors: Daniele Mastantuono, Lund (SE); Sven Mattisson, Bjärred (SE); Roland Strandberg, Furulund (SE); Lars Sundström, Södra Sandby (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 15/651,596

(22) Filed: Jul. 17, 2017

(65) Prior Publication Data

US 2017/0317696 A1 Nov. 2, 2017

Related U.S. Application Data

(63) Continuation of application No. 15/024,729, filed as application No. PCT/EP2015/057000 on Mar. 31, 2015, now Pat. No. 9,748,981.

(51) Int. Cl.
*H04B 7/08* (2006.01)
*H04B 1/00* (2006.01)
(Continued)

(52) U.S. Cl.
CPC ........... *H04B 1/0053* (2013.01); *H03F 3/193* (2013.01); *H03F 3/45179* (2013.01); *H03G 3/20* (2013.01);
(Continued)

(58) Field of Classification Search
CPC .............................. H04W 88/06; H04B 1/005
(Continued)

(56) References Cited

U.S. PATENT DOCUMENTS 7,333,831 B2 * 2/2008 Srinivasan ............. H04B 1/006
330/295
7,489,200 B2 2/2009 Chang et al.
(Continued)

FOREIGN PATENT DOCUMENTS

EP 1 473 845 A1 11/2004
GB 2504973 A1 2/2014

OTHER PUBLICATIONS

Saul Alejandro Rodriguez Duenas, Doctoral Dissertation KTH—Royal Institute of Technology, Stockholm, Sweden, 2009, Title: "Multi-Band Multi-Standard CMOS Receiver Front-Ends for 4G Mobile Applications" TRITA-ICT/MAP AVH Report 2009:10 ISSN 1653-7610, ISRN KTH/ICT-MAP/AVH-2009:10—SE, ISBN 978-91-7415-444-3, dated Nov. 6, 2009 consisting of 153-pages.

*Primary Examiner* — Sonny Trinh
(74) *Attorney, Agent, or Firm* — Christopher & Weisberg, P.A.

(57) ABSTRACT

A radio frequency receiver having a plurality of parallel receiving paths, wherein each path can receive a radio frequency signal in one of a plurality of radio frequency bands and amplify the received signal in a low noise amplifier. The amplified signals from the plurality of parallel paths are combined to one combined radio frequency signal in a common summation node and down-converted to a lower frequency signal in a mixer circuit. Each low noise amplifier comprises a low noise transconductance circuit providing a current signal to drive the common summation node, and an automatic gain control circuit in each path compensates for variations in signal strength independently of signal strengths of signals received by the other receiving paths. The receiver is suitable for simultaneous multiple band reception, where received signal strength can vary between the frequency bands.

20 Claims, 6 Drawing Sheets

(51) Int. Cl.
*H03F 3/193* (2006.01)
*H03F 3/45* (2006.01)
*H03G 3/20* (2006.01)

(52) U.S. Cl.
CPC ........ *H04B 1/005* (2013.01); *H03F 2200/111* (2013.01); *H03F 2200/222* (2013.01); *H03F 2200/294* (2013.01); *H03F 2200/333* (2013.01); *H03F 2200/451* (2013.01); *H03F 2203/45216* (2013.01); *H03F 2203/45288* (2013.01); *H03F 2203/45318* (2013.01)

(58) Field of Classification Search
USPC .................. 455/130, 226.1, 526, 552.1, 132
See application file for complete search history.

(56) References Cited

U.S. PATENT DOCUMENTS

| | | | |
|---|---|---|---|
| 8,374,571 B2 | 2/2013 | Motozawa et al. | |
| 9,154,356 B2* | 10/2015 | Tasic | H03G 3/20 |
| 9,300,420 B2* | 3/2016 | Chang | H04B 1/0064 |
| 9,450,665 B2* | 9/2016 | Sampson | H04B 7/0822 |
| 2010/0056071 A1* | 3/2010 | Rofougaran | H04B 1/14 |
| | | | 455/75 |
| 2010/0261500 A1 | 10/2010 | Karaoguz et al. | |
| 2013/0043946 A1 | 2/2013 | Hadjichristos et al. | |

* cited by examiner

RECEIVING A PLURALITY OF RADIO FREQUENCY BANDS

CROSS-REFERENCE TO RELATED APPLICATION

This application is a continuation of U.S. patent application Ser. No. 15/024,729, filed Mar. 24, 2016, entitled "RECEIVING A PLURALITY OF RADIO FREQUENCY BANDS," which was a Submission Under 35 U.S.C. § 371 for a U.S. National Stage Patent Application of International Application Number PCT/EP2015/057000, filed Mar. 31, 2015 entitled "RECEIVING A PLURALITY OF RADIO FREQUENCY BANDS," the entirety of which are incorporated herein by reference.

TECHNICAL FIELD

The invention relates to a radio frequency receiver configured to receive a plurality of radio frequency bands, a wireless communications device comprising at least one such radio frequency receiver, and a method of receiving a plurality of radio frequency bands.

BACKGROUND

Wireless communication technologies continue to evolve to meet the demand for increased data throughput. This is addressed on many levels with different approaches including higher order modulation, multiple-input and multiple-output (MIMO), scheduling, increased bandwidth, and so on. One way of meeting the challenging capacity gains in next generation wireless networks (e.g. 5G) is by supporting large communication bandwidth. The frequency utilization is likely to span several bands, often denoted communication on non-contiguous intra-band as well as inter-band. Such trend in the telecommunication systems can be solved by multiple parallel receiving paths and is the most common implementation in the literature to date.

One common solution to combine multiple radio frequency bands in a wideband signal is to use a multiband receiver supporting simultaneously two or more frequency bands. The most straightforward way of doing that is to implement the multiband receiver with an entire radio frequency receiver for each radio frequency band. Each of these parallel receivers is then designed to receive a specific radio frequency band. This is the most common solution of the multiband support, where few modifications are needed on top of a copy paste action on an available single frequency band receiver.

Although this solution can be implemented by just using a number of well-known single frequency band receivers in parallel, it also has several disadvantages.

First, it is area consuming as baseband (or low-IF) blocks are replicated. For example, filtering capacitors become large when operating on low bandwidth signals. For the same reason, it is also quite power consuming since multiple base band stages are needed.

Of further disadvantages, it can be mentioned that there is a need for unique and separate local oscillator signal generation for each frequency translating mixer. The local oscillator generation will consume considerable power, and more importantly, unavoidable interaction between these different local oscillator frequencies can cause system performance degradation.

Each mixer should be a quadrature mixer, which will generate imbalance between I and Q path. Any such I/Q imbalance may e.g. cause the image of a first signal in a first band to at least in part overlap a second (desired) signal in the first band or in a second band and thus inhibit or reduce the ability to detect second signal. I/Q-imbalance requirement may call for calibration, which is then needed for each receiver branch. Such estimation and compensation procedure can only be achieved with the wanted accuracy in the digital base band. Each mixer should have its own I/Q imbalance calibration, which is very hard to implement, especially if it becomes frequency dependent and the number of parallel branches increases.

An alternative solution that introduces the idea of reusing some of the receiver blocks is the combination of the narrower signals after the down converting stage, i.e. at base band or low intermediate frequency band. This implementation allows reducing the impact of the multiple routing since a virtual ground is available already at base band, if a direct conversion receiver using a well-established current passive mixer topology is chosen. Since the baseband (or low-IF) blocks are no longer replicated, this solution is less area consuming, and for the same reason, it is also less power consuming. However, the other disadvantages mentioned above are still present also in this solution.

In some solutions, the signals may be added at radio frequency in power, using power combiners. However, also combining the signals in power at radio frequency has some drawbacks. Summation in power will introduce loss in the combiner when supporting isolation between the ports and supporting a rich span of frequencies, i.e. frequency selective power combiners are not considered applicable for this scenario. Further, the driving impedance shown to the mixer, especially if the mixer is a passive one, can be too low, thus degrading the performance of the down-conversion.

US 2013/043946 describes a wireless device including multiple receivers to support different frequency bands, thus trying to reduce circuitry and cost. This solution includes a plurality of low noise amplifiers having outputs that are combined before the combined radio frequency signal is down-converted in a common mixer. Although this disclosure further reduces the consumption of circuit area and power, it does not disclose any possibility to compensate for different signal levels in the different frequency bands, and since received signal strength can vary considerably between the frequency bands, the suggested solution is not suitable for simultaneous multiple band reception. Further, the impedance level of the combined low noise amplifiers outputs will depend on the number of active low noise amplifiers, and as a consequence also the frequency response and the linearity of the circuit will vary in dependence of the number of received bands.

SUMMARY

Therefore, it is an object of embodiments of the invention to provide a radio frequency receiver capable of receiving a plurality of radio frequency bands, and which is suitable for simultaneous multiple band reception, where received signal strength can vary between the frequency bands.

According to embodiments of the invention the object is achieved in a radio frequency receiver configured to receive a plurality of radio frequency bands, the radio frequency receiver comprising a plurality of parallel receiving paths, wherein each receiving path is configured to receive a radio frequency signal in one of said plurality of radio frequency bands and to amplify the received radio frequency signal in a low noise amplifier, the receiver being configured to combine amplified radio frequency signals from the plurality of parallel receiving paths to one combined radio frequency signal in a common summation node and to down-convert said combined radio frequency signal to a lower frequency signal in a mixer circuit. The object is achieved when each one of said low noise amplifiers comprises a low noise transconductance circuit configured to provide a current signal to drive said common summation node, and an automatic gain control circuit configured to compensate for variations in signal strength of the radio frequency signal received by the receiving path comprising the low noise amplifier independently of signal strengths of radio frequency signals received by other receiving paths of the radio frequency receiver.

When the receiver is configured to perform an automatic gain control function separately in each receiver path, simultaneous multiple band reception can be provided, also where received signal strength varies considerably between the received frequency bands.

In some embodiments, the radio frequency receiver further comprises a current driver circuit having an input connected to said common summation node and an output connected to an input of said mixer circuit. In this way, it is possible to keep the impedance at the summation node low, making the solution intrinsically wider band and allowing for an increased number of radio frequency branches. The low impedance summation node also reduces the voltage swing due to the multiple signals, so that the overall linearity is not degraded. The current driver also provides isolation between the radio frequency summing node and the radio frequency input of the mixer, thereby keeping the loading impedance driving the mixer independent of the number of input stages.

The current driver circuit may comprise circuitry for adjusting its input impedance in dependence of a number of parallel receiving paths receiving radio frequency signals at a given time. The possibility of increasing or decreasing the impedance of the current driver dynamically when the number of active receiving paths decreases or increases allows the frequency response and the linearity performance to be kept constant, so that the frequency and linearity performance does not depend on the number of radio frequency inputs enabled.

The current driver circuit may further comprise an auxiliary output connected to circuitry for measurement and correction of I/Q imbalance, said auxiliary output being isolated from the output connected to an input of said mixer circuit. Having a separate I/Q measurement output isolated from the receive path ensures that I/Q imbalance estimation and compensation can be performed independently of the number of active radio frequency bands and without affecting the receive path.

The radio frequency receiver may further be configured to utilize said auxiliary output for at least one of power detection, 1/f noise removal and transmission signal cancellation.

In some embodiments, the mixer circuit is configured to down-convert said combined radio frequency signal to a baseband signal.

A wireless communications device may comprise at least one radio frequency receiver as described above. In this way, the wireless communications device benefits from the described advantages of the radio frequency receiver. In one embodiment, the wireless communications device is a base station for a wireless communications system. In another embodiment, the wireless communications device is a mobile phone use in a wireless communications system.

As mentioned, the invention further relates to a method of receiving a plurality of radio frequency bands in a radio frequency receiver comprising a plurality of parallel receiving paths, the method comprising the steps of receiving in each receiving path a radio frequency signal in one of said plurality of radio frequency bands; compensating, in an automatic gain control circuit in each one of said low noise amplifiers, for variations in signal strength of the radio frequency signal received by the receiving path comprising the low noise amplifier independently of signal strengths of radio frequency signals received by other receiving paths of the radio frequency receiver; amplifying in each receiving path the compensated radio frequency signal in a low noise amplifier; providing by a low noise transconductance circuit in each one of said low noise amplifiers a current signal to drive a common summation node; combining amplified and compensated radio frequency current signals from the plurality of parallel receiving paths to one combined radio frequency signal in said common summation node; and down-converting said combined radio frequency signal to a lower frequency signal in a mixer circuit.

When variations in signal strength is compensated by performing an automatic gain control function separately in each receiver path, simultaneous multiple band reception can be provided, also where received signal strength varies considerably between the received frequency bands.

In some embodiments, the method further comprises the step of providing the combined radio frequency signal from said common summation node to an input of said mixer circuit by a current driver circuit having an input connected to said common summation node and an output connected to an input of said mixer circuit. In this way, it is possible to keep the impedance at the summation node low, making the solution intrinsically wider band and allowing for an increased number of radio frequency branches. The low impedance summation node also reduces the voltage swing due to the multiple signals, so that the overall linearity is not degraded. The current driver also provides isolation between the radio frequency summing node and the radio frequency input of the mixer, thereby keeping the loading impedance driving the mixer independent of the number of input stages.

The method may further comprise the step of adjusting an input impedance of the current driver circuit in dependence of a number of parallel receiving paths receiving radio frequency signals at a given time. The possibility of increasing or decreasing the impedance of the current driver dynamically when the number of active receiving paths decreases or increases allows the frequency response and the linearity performance to be kept constant, so that the frequency and linearity performance does not depend on the number of radio frequency inputs enabled.

The method may further comprise the step of providing by the current driver circuit an auxiliary output, isolated from the output connected to an input of said mixer circuit, to circuitry for measurement and correction of I/Qimbalance. Having a separate I/Q measurement output isolated from the receive path ensures that I/Q imbalance estimation and compensation can be performed independently of the number of active radio frequency bands and without affecting the receive path.

The method may further comprise the step of further utilizing said auxiliary output for at least one of power detection, 1/f noise removal and transmission signal cancellation.

In some embodiments, the method may further comprise the step of down-converting said combined radio frequency signal in said mixer circuit to a baseband signal.

BRIEF DESCRIPTION OF THE DRAWINGS

Embodiments of the invention will now be described more fully below with reference to the drawings, in which.

DETAILED DESCRIPTION

Figure 1:
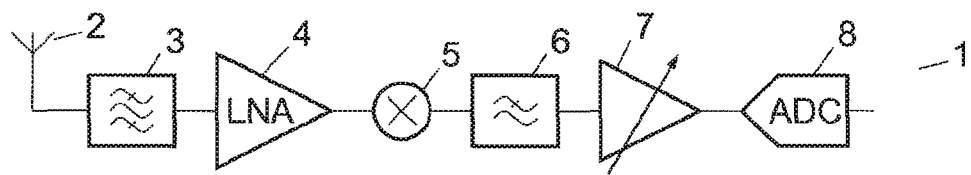
FIG. 1 shows a block diagram of a radio frequency receiver for a single radio frequency band.

FIG. 1 illustrates an example of a block diagram of a radio frequency receiver 1 for a specific radio frequency band. The radio frequency receiver 1 can be used in e.g. a wireless communications device, such as a base station or a mobile phone for use in a wireless communications system. In this example, a radio frequency signal received by an antenna 2 is connected to an input band pass filter 3 having a pass band corresponding to the specific radio frequency band of the receiver. The band pass filtered signal is then amplified in a low noise amplifier 4 and fed to a quadrature mixer 5, in which it is down converted to a baseband quadrature input signal comprising I-phase and Q-phase components or to a corresponding intermediate frequency signal. In this example, the down-converted signal is then fed via a filter 6 and an amplifier 7 to an analog-to-digital converter 8 for further processing.

In wireless communication technologies there is an increasing demand for increased data throughput. One way of meeting the challenging capacity gains in next generation wireless networks (e.g. 5 G) is by supporting large communication bandwidth. The frequency utilization is likely to span several bands, often denoted communication on non-contiguous intra-band as well as inter-band.

This trend in the telecommunication systems can be solved by multiple parallel receiving paths. Thus multiple radio frequency bands in a wideband signal can be combined by using a multiband receiver supporting simultaneously two or more frequency bands.

Figure 2:
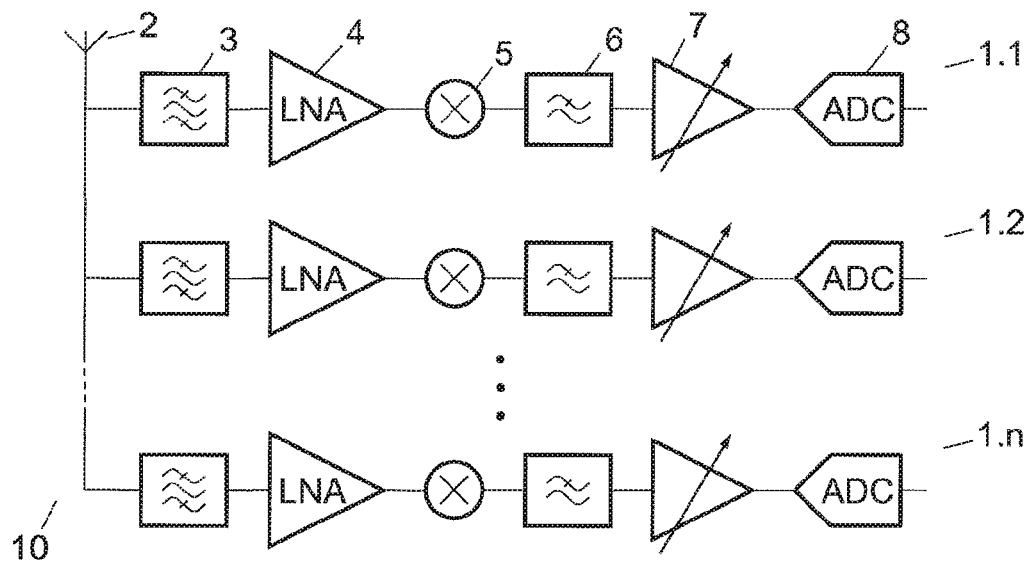
FIG. 2 shows a multiband receiver with an entire radio frequency receiver for each radio frequency band.

FIG. 2 shows a straightforward way of doing that by implementing the multiband receiver with an entire radio frequency receiver for each radio frequency band. The receiver 10 has a number of parallel receiver paths 1.1, 1.2, ..., 1.n, each of which like the receiver 1 in FIG. 1 is connected to the antenna 2 and comprises an input band pass filter 3, a low noise amplifier 4, a quadrature mixer 5, a filter 6, an amplifier 7 and an analog-to-digital converter 8. Each of these parallel receivers is designed to receive a specific radio frequency band, e.g. by designing the input band pass filter 3 to have a pass band corresponding to the specific radio frequency band of that receiver.

This is the most common solution of the multiband support, where few modifications are needed in addition to a copy paste action on the available single frequency band receiver. Although this solution can be implemented by just using a number of well-known single frequency band receivers in parallel, it also has several disadvantages.

The solution is area consuming as the baseband (or low-IF) blocks, i.e. the filter 6, the amplifier 7 and the analog-to-digital converter 8, are replicated. For example, filtering capacitors become large when operating on low bandwidth signals. For the same reason, the receiver is also quite power consuming since multiple base band stages are needed. Further, there is a need for unique and separate local oscillator signal generation for each frequency translating mixer 5. The local oscillator generation will consume considerable power, and more importantly, unavoidable interaction between these different local oscillator frequencies can cause system performance degradation.

Each mixer 5 should be a quadrature mixer, which will generate imbalance between I and Q path. Any such I/Q imbalance may e.g. cause the image of a first signal in a first band to at least in part overlap a second (desired) signal in the first band or in a second band and thus inhibit or reduce the ability to detect the second signal. I/Q-imbalance requirement may call for calibration, which is then needed for each receiver branch. Such estimation and compensation procedure can only be achieved with the wanted accuracy in the digital base band. Each mixer should have its own I/Q imbalance calibration, which is very hard to implement, especially if it becomes frequency dependent and the number of parallel branches increases.

Figure 3:
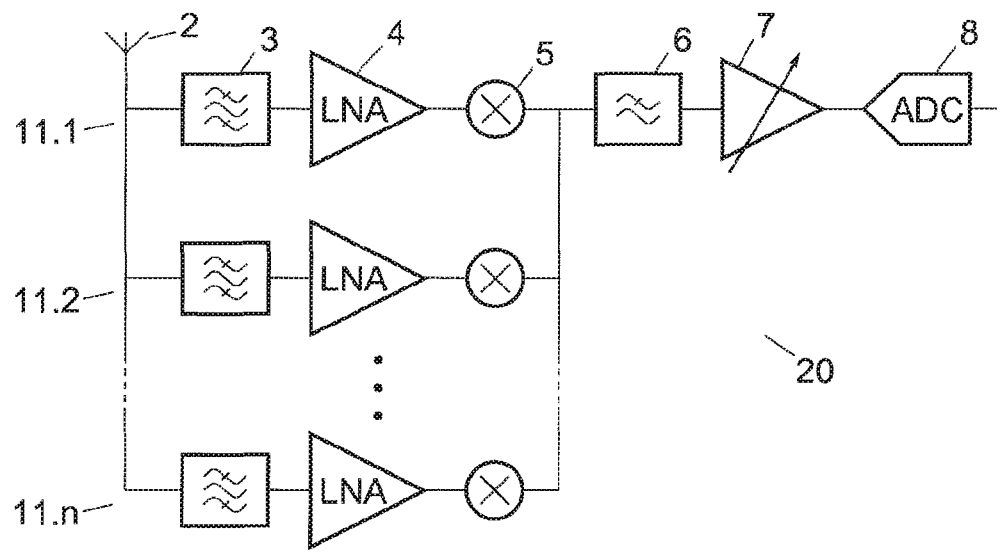
FIG. 3 shows a multiband receiver where signals are combined after down converting to baseband or intermediate frequency.

FIG. 3 shows an alternative solution that introduces the idea of reusing some of the receiver blocks by combining the narrower signals after the down converting stage, i.e. at base band or low intermediate frequency band. Like the receiver 10 of FIG. 2, the receiver 20 in FIG. 3 has a number of parallel receiver paths 11.1, 11.2, ..., 11.n, each of which is connected to the antenna 2. Each path comprises an input band pass filter 3, a low noise amplifier 4 and a quadrature mixer 5, while the filter 6, the amplifier 7 and the analog-to-digital converter 8 are shared by all paths. Each of the parallel receiver paths is also here designed to receive a specific radio frequency band, e.g. by designing the input band pass filter 3 to have a pass band corresponding to the specific radio frequency band of that receiver.

This implementation allows reducing the impact of the multiple routing since a virtual ground is available already at base band, if a direct conversion receiver using a well-established current passive mixer topology is chosen. Since the baseband (or low-IF) blocks are no longer replicated, this solution is less area consuming, and for the same reason, it is also less power consuming. However, the other disadvantages mentioned above are still present also in this solution.

Figure 4:
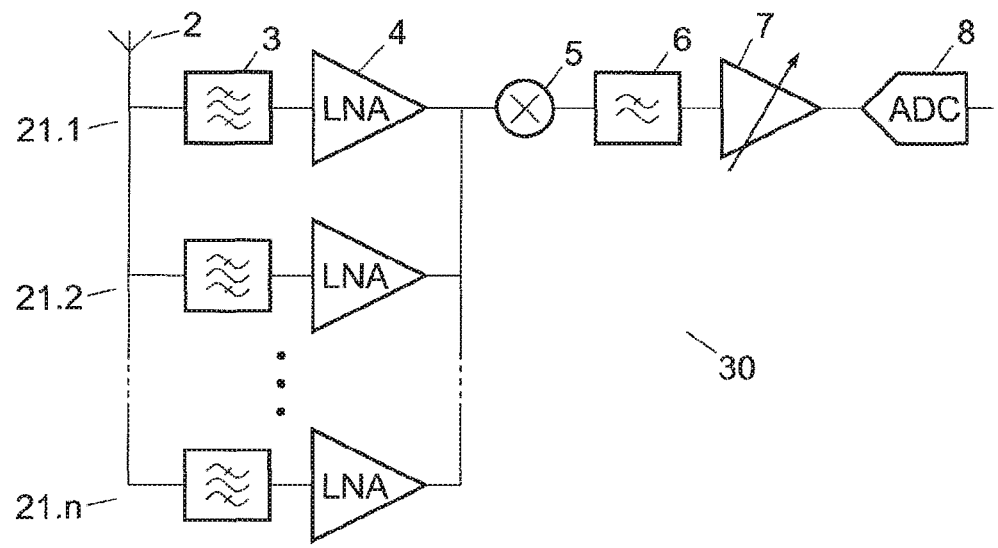
FIG. 4 shows a multiband receiver where radio frequency signals are combined before down converting to baseband or intermediate frequency.

FIG. 4 shows a receiver, where the narrower signals from the multiple receiver paths are combined before the down-converting stage in the mixer 5. Also the receiver 30 in FIG. 4 has a number of parallel receiver paths 21.1, 21.2, ..., 21.n, each of which is connected to the antenna 2. Each path comprises an input band pass filter 3 and a low noise amplifier 4, while the quadrature mixer 5, the filter 6, the amplifier 7 and the analog-to-digital converter 8 are shared by all paths. Each of the parallel receiver paths is also here designed to receive a specific radio frequency band, e.g. by designing the input band pass filter 3 to have a pass band corresponding to the specific radio frequency band of that receiver.

In an embodiment of a receiver, shown as the receiver 40 in FIG. 5 and described below, the low noise amplifier 4 in each receiver path of the receiver 30 in FIG. 4 has been replaced by a low noise transconductance 14. Thus, also the receiver 40 in FIG. 5 has a number of parallel receiver paths 31.1, 31.2, . . . , 31.n, each of which is connected to the antenna 2. Each path comprises an input band pass filter 3 and a low noise transconductance 14, while the quadrature mixer 5, the filter 6, the amplifier 7 and the analog-to-digital converter 8 are shared by all paths.

This receiver 40 implements a solution for receiving simultaneously multiple radio frequency bands to be combined into a wideband signal. The radio frequency bands can be either contiguous or non-contiguous. The apparatus is divided in multiple radio frequency path blocks added together at radio frequency. In addition to just amplification, the low noise transconductance 14 can include different functions, such as filters, Automatic Gain Control (AGC), Variable Gain Amplifier (VGA), Programmable Gain Amplifier (PGA) and analog signal processing. The different functions of the individual low noise transconductances 14 are independent of the corresponding functions in the other receiver paths, thus allowing reception of multiple bands with different signal strength. Without separated AGC functionality for each radio frequency branch, the solution would not be suitable for a simultaneous multiple band receiver.

The receiver 40 allows reception of multiple radio frequency bands without introducing any additional source of I/Q imbalance compared to that of a conventional single band receiver. This is due to the fact that there is always only one mixer, since the number of down-converting stages is not correlated to the number of radio frequency branches or, in other words, to the number of radio frequency bands received.

Figure 5:
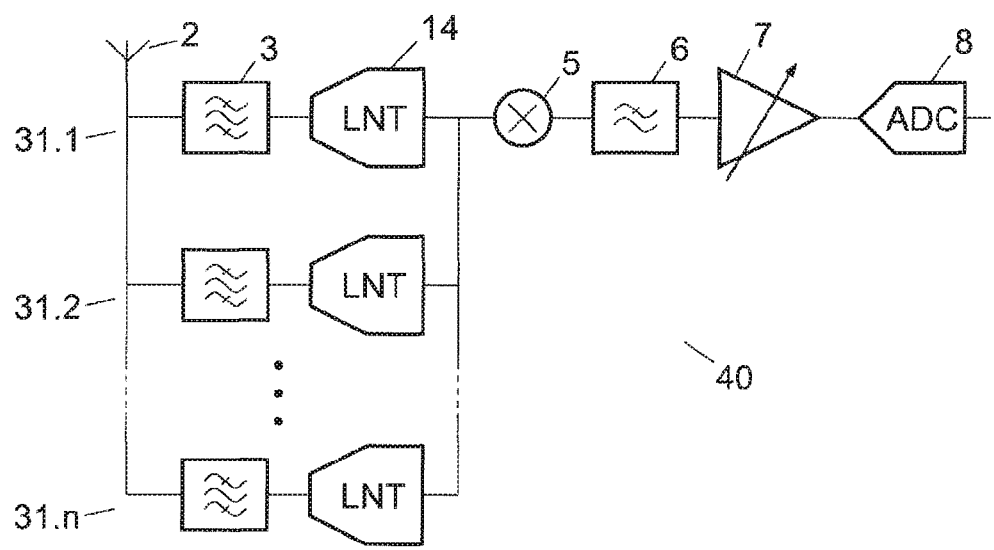
FIG. 5 shows a multiband receiver where radio frequency signals are amplified in a low noise transconductance in each path and combined before down converting to baseband or intermediate frequency.
Figure 6:
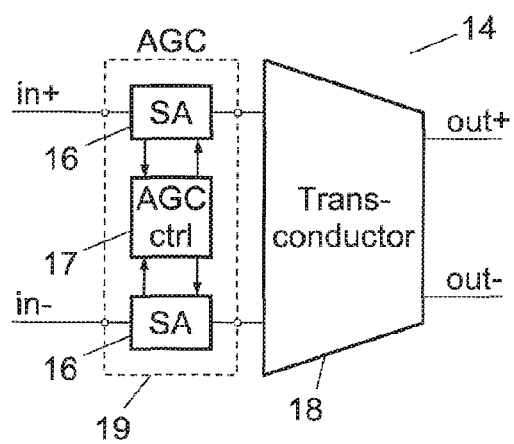
FIG. 6 shows a block diagram of an example of an implementation of a low noise transconductance of FIG. 5.

FIG. 6 shows a block diagram of an example of an implementation of the low noise transconductance 14. Although the low noise transconductance 14 in FIG. 5 is shown as being single-ended, the implementation in FIG. 6 is shown as differential, which will typically be the case. The differential input signals in+ and in− are fed to an AGC circuit 19 performing the AGC functionality for the low noise transconductance 14 in this receiver path. The AGC circuit 19 comprises a step attenuator 16 for each differential input signal in+ and in− and an AGC control unit 17 that controls the step attenuators 16 based on signal strengths detected at the inputs, so that the signals can be attenuated accordingly in the step attenuators 16. The step attenuators 16 can be a generic design and/or an outside stand-alone component. The level of attenuation is provided according to the detection of the signals coming into the different inputs. Each input can have different attenuation levels. The differential signals attenuated in the step attenuators 16 are then fed to a transductor circuit 18 providing the differential output signals out+ and out− in the current domain.

Figure 7:
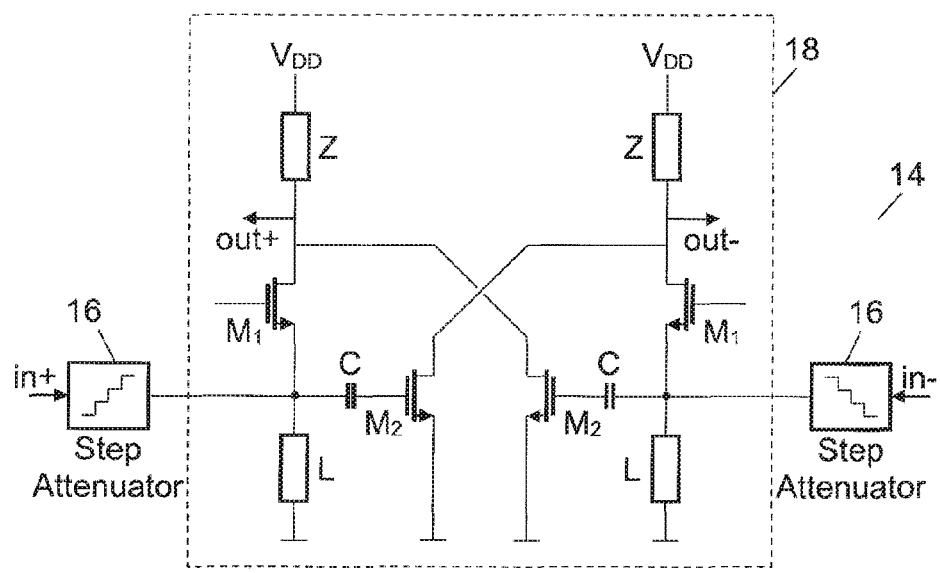
FIG. 7 shows an example of an implementation on transistor level of a low noise transconductance of FIG. 5.

FIG. 7 is a more detailed illustration on transistor level, according to an embodiment, of parts of the circuit in FIG. 6. For reasons of simplicity, the AGC control unit 17 is not shown in FIG. 7. Also the implementation in FIG. 7 is shown as differential, which will typically be the case. The differential input signal in+ and in− is first attenuated in the step attenuators 16 performing the AGC functionality together with the AGC control unit 17 of FIG. 6 for the low noise transconductance 14 in this receiver path. The level of attenuation is provided according to the detection of the signals coming into the different inputs. Each input can have different attenuation levels. In the transconductor circuit 18, the transistors $M_1$ and $M_2$ in each half of the circuit provide input matching and amplification. The attenuated signals from the step attenuators 16 are coupled to transistors $M_2$ through an AC coupling capacitor C and connected to ground through an inductance L. A generic load Z is shown, but it can also be a more complex bias network.

With the separated AGC functionality for each radio frequency branch, the receiver 40 of FIG. 5 is more suitable for a simultaneous multiple band receiver. Further, the outputs of the radio frequency paths are summed before entering the mixer 5 at a radio frequency summing node. Summation in current domain is most favorable as the summation is achieved by simply routing the outputs together.

Figure 8:
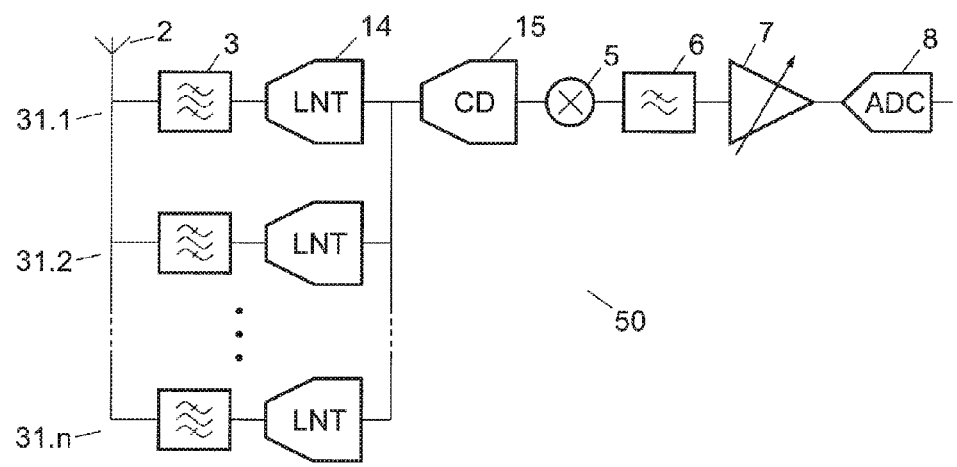
FIG. 8 shows a multiband receiver as in FIG. 5 where the combined signal is coupled to a down-converting mixer through a current driver.

The receiver 40 of FIG. 5 can be further improved by connecting the summation node to the mixer 5 via a current driver 15 as shown in the receiver 50 of FIG. 8. Without this current driver, the radio frequency summing node will have a higher signal level than in the single path receiver, thus stressing the linearity requirements of the low noise transconductance 14, and adding more low noise transconductances in parallel to increase the number of parallel inputs increases the capacitive load of the summing node, thus reducing the bandwidth of the front-end. Further, the mixer linearity is reduced when feeding it from a finite impedance circuit, here caused by parasitic capacitance in routing network of the summation node. Therefore, the number of radio frequency paths in parallel will be limited.

Figure 9:
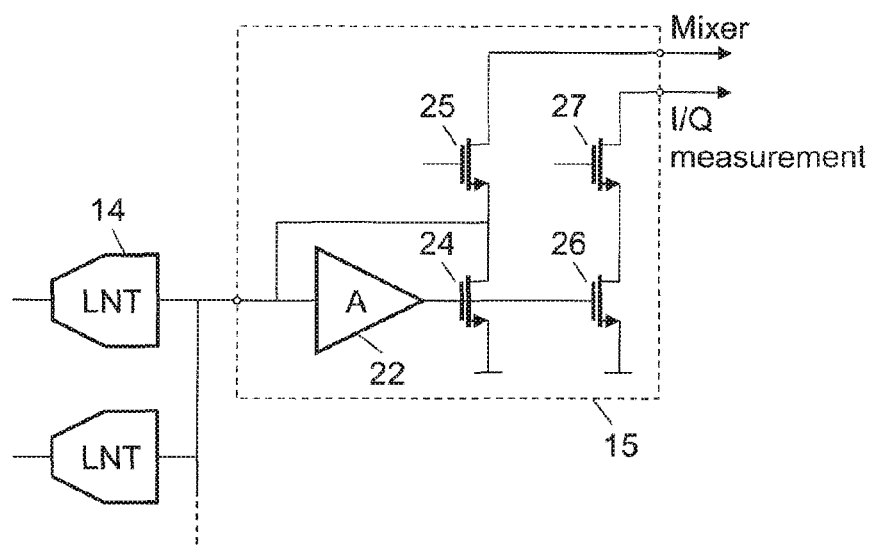
FIG. 9 shows an example of an implementation of a current driver of FIG. 8.

An example of the implementation of the current driver 15 is illustrated in FIG. 9. The signal from the summing node of the low noise transconductances 14 is coupled via an amplification stage 22 to the gate terminal of a MOSFET transistor 24, which provides signal amplification of the signal. The drain terminal of transistor 24 is connected to the input of the amplification stage 22 as a feedback signal and to the source terminal of a further transistor 25 that provides the amplified signal to the input of the mixer 5.

With the current driver 15 it is possible to lower the impedance at the summation node, making the solution intrinsically wider band and allowing for an increased number of radio frequency branches. The low impedance summation node also reduces the voltage swing due to the multiple signals, not degrading the overall linearity. To keep the frequency response and the linearity performance constant, the impedance of the current driver 15 should be increased or decreased dynamically when the number of active low noise transconductances 14 decreases or increases, thus solving the problem of the frequency and linearity performance dependence on the number of RF inputs enabled. The possibility to modify the impedance of the current driver 15 is crucial to keep the performance constant and allow a high number of radio frequency inputs "transparently".

The current driver 15 also provides isolation between the radio frequency summing node and the radio frequency input of the mixer, thereby keeping the loading impedance driving the mixer independent of the number of input stages. The capacitive load will not increase at the input of the passive mixer. This optimizes the mixer performance, especially in terms of linearity.

These advantages, i.e. low impedance summing node, high driving impedance for the mixer and isolation between radio frequency inputs and output, are achieved in the current driver 15 shown in FIG. 9. If the number of low noise transconductances 14 that are active at the same time increases, the input impedance modification of this stage needed to keep the performance constant can be done by either making the amplification A of the amplifier 22 variable or changing the bias current flowing in transistor 24.

As illustrated in FIG. 9, the current driver 15 may, in some embodiments, also comprise a second stage with the transistors 26 and 27. This stage provides a replica of the current signal for I/Q imbalance correction with relatively good isolation from the path with transistors 24 and 25 and independently of the number of radio frequency inputs. In some embodiments, the implementation of such a correction is done through an auxiliary receiver. If the current driver 15 had been constant, even the I/Q measurement would have been effected by the number of radio frequency inputs.

The stage for I/Q measurement can be used not just for I/Q imbalance correction, but also for e.g. power detection, 1/f noise removal and transmitter signal cancellation. Even in those cases, without an additional stage keeping constant the overall performance, those functionalities would have been dependent on the number of radio frequency inputs.

Thus, with an available current replica for a parallel measurement path, providing isolation between the receive path and the I/Q measurement path, the current driver 15 introduces a new common radio frequency node suitable for I/Q imbalance estimation and compensation. This means that the receiver 50 implements the solution of receiving multiple bands simultaneously, without increasing the I/Q imbalance compared to a single receiver solution, but making available a new radio frequency node for the I/Q imbalance correction itself.

Thus, the receiver 50 implements the combination of multiple radio frequency signal bands simultaneously to be combined into a wideband signal. This solution is implemented with a current summation at radio frequency to yield only a single source of I/Q imbalance across multiple bands. Moreover, this solution is less sensitive to the parasitic capacitance due to the multiple radio frequency paths or other calibration/measurement circuits, allowing a high number of radio frequency inputs. The addition of a common current stage indeed provides isolation between the radio frequency summing node and the input of the mixer and between the main radio frequency signal path and the auxiliary path used for calibration/measurements.

The apparatus proposed implements a solution of receiving simultaneously multiple radio frequency bands to be combined into a wideband signal without introducing any additional source of I/Q imbalance compared to a single band receiver. Moreover, with a single common radio frequency node available, it is possible to correct the I/Q imbalance itself and also to implement other signal processing operations like power detection, 1/f noise removal and transmitter signal cancellation. The current topology choice uses a current driver 15 at the summing radio frequency node, allowing increased number of inputs and reducing the effect of the capacitive load in the summing node (for example due to the summing network and the I/Q calibration circuit) without affecting the linearity and band of the receiver or the performance of the passive mixer.

Among the advantages of this solution with signal combination at radio frequency, it can be mentioned that it provides a simple and robust distribution of local oscillator signal, resulting in low power consumption. There is one single source of I/Q imbalance due to the single quadrature mixer. A single common radio frequency node is available to perform I/Q-imbalance correction and also for measurement and/or injection needed for power detection, 1/f noise removal and transmitter signal cancellation. The implementation of the summing node in current allows increasing the number of parallel paths, introducing a summing stage with low input impedance proportional to the number of parallel channels. This property can be improved by technology downscaling.

Figure 10:
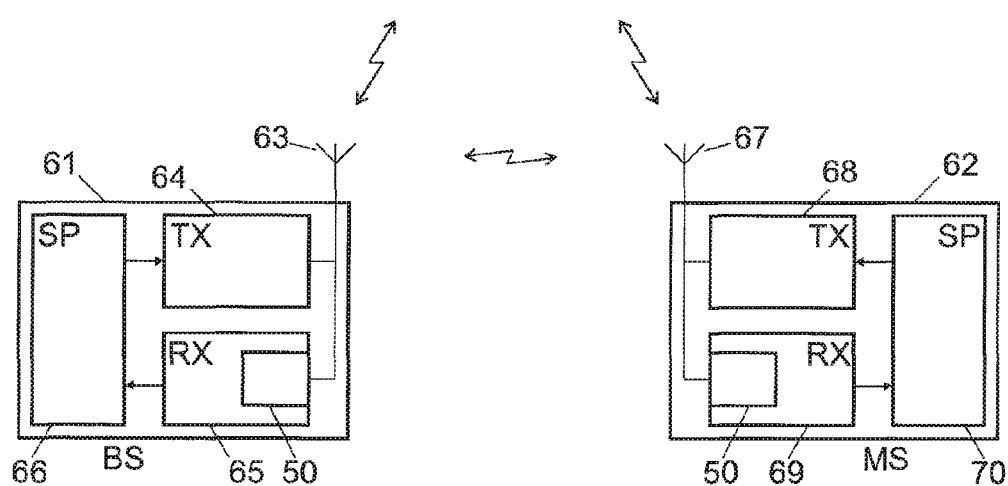
FIG. 10 shows a base station and a mobile station in which a multiband receiver can be used.

FIG. 10 shows an example of a wireless communications system, in which a receiver as described above can be used. Radio frequency signals are transmitted between two wireless communications devices, which are here exemplified by a base station 61 and a wireless terminal 62, such as a mobile phone, a machine-type communication (MTC) device, or a computer, a tablet device, or other device equipped with a cellular data modem. In the base station 61, an antenna 63 is connected to a transmitter part 64 and a receiver part 65, which are both connected to a signal processing unit 66. As illustrated, the base station 61 comprises a receiver, e.g. the receiver 50 of FIG. 8, for receiving simultaneously multiple radio frequency bands. Similarly, in the wireless terminal 62, an antenna 67 is connected to a transmitter part 68 and a receiver part 69, which are both connected to a signal processing unit 70. As illustrated, the wireless terminal 62 comprises a receiver, e.g. the receiver 50 of FIG. 8, for receiving simultaneously multiple radio frequency bands.

Figure 11:
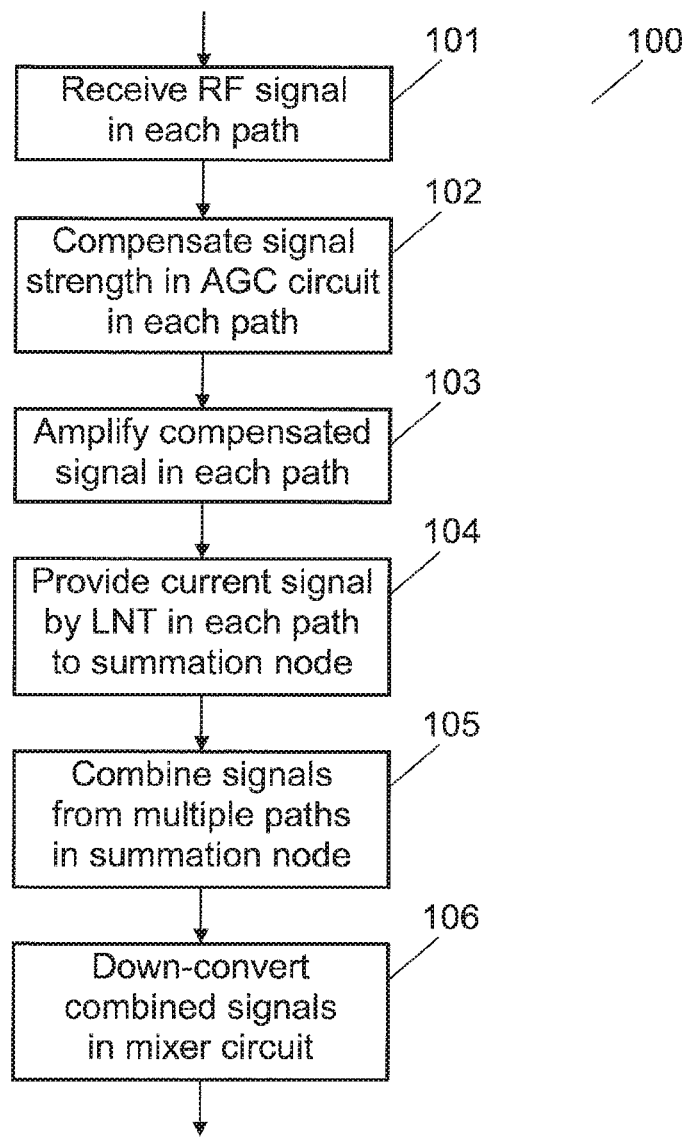
FIG. 11 shows a flow chart illustrating a method of receiving a plurality of radio frequency bands in a radio frequency receiver.

FIG. 11 shows a flow chart 100 illustrating a method of receiving a plurality of radio frequency bands in a radio frequency receiver comprising a plurality of parallel receiving paths. In step 101, a radio frequency signal in one of a plurality of radio frequency bands is received in each receiving path of the receiver. In each receiving path the signal is compensated in step 102 for variations in signal strength of the received radio frequency signal in an automatic gain control circuit independently of signal strengths of the signals received by other receiving channels of the radio frequency receiver, and in step 103, the compensated radio frequency signal is amplified. In step 104, the amplified and compensated signal is then provided as a current signal by a low noise transconductance circuit to a common summation node, in which the radio frequency signals from the plurality of parallel receiving paths are combined in step 105 to one combined radio frequency signal. The combined radio frequency signal is then down-converted in step 106 to a baseband signal or an intermediate frequency signal in a mixer circuit.

In other words, there is disclosed a radio frequency receiver 40; 50 configured to receive a plurality of radio frequency bands, the radio frequency receiver comprising a plurality of parallel receiving paths 31.1, 31.2, 31.n, wherein each receiving path 31.1; 31.2; 31.n is configured to receive a radio frequency signal in one of said plurality of radio frequency bands and to amplify the received radio frequency signal in a low noise amplifier, the receiver being configured to combine amplified radio frequency signals from the plurality of parallel receiving paths 31.1, 31.2, 31.n to one combined radio frequency signal in a common summation node and to down-convert said combined radio frequency signal to a lower frequency signal in a mixer circuit 5. The object is achieved when each one of said low noise amplifiers comprises a low noise transconductance circuit 14 configured to provide a current signal to drive said common summation node, and an automatic gain control circuit 19 configured to compensate for variations in signal strength of the radio frequency signal received by the receiving path 31.1; 31.2; 31.n comprising the low noise amplifier independently of signal strengths of radio frequency signals received by other receiving paths of the radio frequency receiver.

When the receiver is configured to perform an automatic gain control function separately in each receiver path, simultaneous multiple band reception can be provided, also where received signal strength varies considerably between the received frequency bands.

In some embodiments, the radio frequency receiver further comprises a current driver circuit 15 having an input connected to said common summation node and an output connected to an input of said mixer circuit 5. In this way, it is possible to keep the impedance at the summation node low, making the solution intrinsically wider band and allowing for an increased number of radio frequency branches. The low impedance summation node also reduces the voltage swing due to the multiple signals, so that the overall linearity is not degraded. The current driver 15 also provides isolation between the radio frequency summing node and the radio frequency input of the mixer, thereby keeping the loading impedance driving the mixer independent of the number of input stages.

The current driver circuit 15 may comprise circuitry for adjusting its input impedance in dependence of a number of parallel receiving paths receiving radio frequency signals at a given time. The possibility of increasing or decreasing the impedance of the current driver 15 dynamically when the number of active receiving paths decreases or increases allows the frequency response and the linearity performance to be kept constant, so that the frequency and linearity performance does not depend on the number of radio frequency inputs enabled.

The current driver circuit 15 may further comprise an auxiliary output connected to circuitry for measurement and correction of I/Q imbalance, said auxiliary output being isolated from the output connected to an input of said mixer circuit. Having a separate I/Q measurement output isolated from the receive path ensures that I/Q imbalance estimation and compensation can be performed independently of the number of active radio frequency bands and without affecting the receive path.

The radio frequency receiver may further be configured to utilize said auxiliary output for at least one of power detection, 1/f noise removal and transmission signal cancellation.

In some embodiments, the mixer circuit 5 is configured to down-convert said combined radio frequency signal to a baseband signal.

A wireless communications device may comprise at least one radio frequency receiver as described above. In this way, the wireless communications device benefits from the described advantages of the radio frequency receiver. In one embodiment, the wireless communications device is a base station for a wireless communications system. In another embodiment, the wireless communications device is a mobile phone use in a wireless communications system.

As mentioned, the invention further relates to a method of receiving a plurality of radio frequency bands in a radio frequency receiver comprising a plurality of parallel receiving paths 31.1, 31.2, 31.n, the method comprising the steps of receiving 101 in each receiving path a radio frequency signal in one of said plurality of radio frequency bands; compensating 102, in an automatic gain control circuit in each one of said low noise amplifiers, for variations in signal strength of the radio frequency signal received by the receiving path comprising the low noise amplifier independently of signal strengths of radio frequency signals received by other receiving paths of the radio frequency receiver; amplifying 103 in each receiving path the compensated radio frequency signal in a low noise amplifier; providing 104 by a low noise transconductance circuit in each one of said low noise amplifiers a current signal to drive a common summation node; combining 105 amplified and compensated radio frequency current signals from the plurality of parallel receiving paths to one combined radio frequency signal in said common summation node; and down-converting 106 said combined radio frequency signal to a lower frequency signal in a mixer circuit.

When variations in signal strength is compensated by performing an automatic gain control function separately in each receiver path, simultaneous multiple band reception can be provided, also where received signal strength varies considerably between the received frequency bands.

In some embodiments, the method further comprises the step of providing the combined radio frequency signal from said common summation node to an input of said mixer circuit by a current driver circuit 15 having an input connected to said common summation node and an output connected to an input of said mixer circuit. In this way, it is possible to keep the impedance at the summation node low, making the solution intrinsically wider band and allowing for an increased number of radio frequency branches. The low impedance summation node also reduces the voltage swing due to the multiple signals, so that the overall linearity is not degraded. The current driver 15 also provides isolation between the radio frequency summing node and the radio frequency input of the mixer, thereby keeping the loading impedance driving the mixer independent of the number of input stages.

The method may further comprise the step of adjusting an input impedance of the current driver circuit 15 in dependence of a number of parallel receiving paths receiving radio frequency signals at a given time. The possibility of increasing or decreasing the impedance of the current driver 15 dynamically when the number of active receiving paths decreases or increases allows the frequency response and the linearity performance to be kept constant, so that the frequency and linearity performance does not depend on the number of radio frequency inputs enabled.

The method may further comprise the step of providing by the current driver circuit 15 an auxiliary output, isolated from the output connected to an input of said mixer circuit, to circuitry for measurement and correction of I/Q imbalance. Having a separate I/Q measurement output isolated from the receive path ensures that I/Q imbalance estimation and compensation can be performed independently of the number of active radio frequency bands and without affecting the receive path.

The method may further comprise the step of further utilizing said auxiliary output for at least one of power detection, 1/f noise removal and transmission signal cancellation.

In some embodiments, the method may further comprise the step of down-converting said combined radio frequency signal in said mixer circuit 5 to a baseband signal.

Although various embodiments of the present invention have been described and shown, the invention is not restricted thereto, but may also be embodied in other ways within the scope of the subject-matter defined in the following claims.

The invention claimed is:
1. A radio frequency receiver configured to receive a plurality of radio frequency bands, the radio frequency receiver comprising a plurality of parallel receiving paths, each receiving path being configured to receive a radio frequency signal in one of the plurality of radio frequency bands and to amplify the received radio frequency signal in a low noise amplifier, the receiver being configured to combine amplified radio frequency signals from the plurality of parallel receiving paths to one combined radio frequency signal in a common summation node and to down-convert the combined radio frequency signal to a lower frequency signal in a mixer circuit each one of the low noise amplifiers comprising:
- a low noise transconductance circuit configured to provide a current signal to drive the common summation node; and
- an automatic gain control circuit configured to compensate for variations in signal strength of the radio frequency signal received by the receiving path comprising the low noise amplifier independently of signal strengths of radio frequency signals received by other receiving paths of the radio frequency receiver.

2. The radio frequency receiver according to claim 1, wherein the radio frequency receiver further comprises a current driver circuit having an input connected to the common summation node and an output connected to an input of the mixer circuit.

3. The radio frequency receiver according to claim 2, wherein the current driver circuit comprises circuitry for adjusting an input impedance of the driver circuit in dependence of a number of parallel receiving paths receiving radio frequency signals at a given time.

4. The radio frequency receiver according to claim 3, wherein the mixer circuit is configured to down-convert the combined radio frequency signal to a baseband signal.

5. The radio frequency receiver according to claim 2, wherein the mixer circuit is configured to down-convert the combined radio frequency signal to a baseband signal.

6. The radio frequency receiver according to claim 2, wherein the current driver circuit further comprises an auxiliary output connected to circuitry for measurement and correction of I/Q imbalance, the auxiliary output being isolated from the output connected to an input of the mixer circuit.

7. The radio frequency receiver according to claim 6, wherein the radio frequency receiver is further configured to utilize the auxiliary output for at least one of power detection, 1/f noise removal and transmission signal cancellation.

8. The radio frequency receiver according to claim 7, wherein the mixer circuit is configured to down-convert the combined radio frequency signal to a baseband signal.

9. The radio frequency receiver according to claim 1, wherein the mixer circuit is configured to down-convert the combined radio frequency signal to a baseband signal.

10. A wireless communications device comprising at least one radio frequency receiver, the at least one radio frequency receiver configured to receive a plurality of radio frequency bands, the radio frequency receiver comprising a plurality of parallel receiving paths, each receiving path being configured to receive a radio frequency signal in one of the plurality of radio frequency bands and to amplify the received radio frequency signal in a low noise amplifier, the receiver being configured to combine amplified radio frequency signals from the plurality of parallel receiving paths to one combined radio frequency signal in a common summation node and to down-convert said combined radio frequency signal to a lower frequency signal in a mixer circuit, each one of the low noise amplifiers comprising:
- a low noise transconductance circuit configured to provide a current signal to drive said common summation node, and
- an automatic gain control circuit configured to compensate for variations in signal strength of the radio frequency signal received by the receiving path comprising the low noise amplifier independently of signal strengths of radio frequency signals received by other receiving paths of the radio frequency receiver.

11. The wireless communications device according to claim 10, wherein the wireless communications device is a base station for a wireless communications system.

12. The wireless communications device according to claim 10, wherein the wireless communications device is a mobile phone for use in a wireless communications system.

13. A method of receiving a plurality of radio frequency bands in a radio frequency receiver comprising a plurality of parallel receiving paths, the method comprising the steps of:
- receiving in each receiving path a radio frequency signal in one of the plurality of radio frequency bands;
- compensating, in an automatic gain control circuit in each one of the low noise amplifiers, for variations in signal strength of the radio frequency signal received by the receiving path comprising the low noise amplifier independently of signal strengths of radio frequency signals received by other receiving paths of the radio frequency receiver;
- amplifying in each receiving path the compensated radio frequency signal in a low noise amplifier;
- providing by a low noise transconductance circuit in each one of the low noise amplifiers a current signal to drive a common summation node;
- combining amplified and compensated radio frequency current signals from the plurality of parallel receiving paths to one combined radio frequency signal in the common summation node; and
- down-converting the combined radio frequency signal to a lower frequency signal in a mixer circuit.

14. The method according to claim 13, further comprising the step of providing the combined radio frequency signal from the common summation node to an input of the mixer circuit by a current driver circuit having an input connected to the common summation node and an output connected to an input of the mixer circuit.

15. The method according to claim 14, further comprising the step of adjusting an input impedance of the current driver circuit in dependence of a number of parallel receiving paths receiving radio frequency signals at a given time.

16. The method according to claim 14, further comprising the step of providing by the current driver circuit an auxiliary output, isolated from the output connected to an input of the mixer circuit, to circuitry for measurement and correction of I/Q imbalance.

17. The method according to claim 14, further comprising the step of down-converting the combined radio frequency signal in the mixer circuit to a baseband signal.

18. The method according to claim 17, further comprising the step of further utilizing the auxiliary output for at least one of power detection, 1/f noise removal and transmission signal cancellation.

19. The method according to claim 18, further comprising the step of down-converting the combined radio frequency signal in the mixer circuit to a baseband signal.

20. The method according to claim 13, further comprising the step of down-converting the combined radio frequency signal in the mixer circuit to a baseband signal.

* * * * *